United States Patent
Griffin et al.

(10) Patent No.: US 11,332,828 B2
(45) Date of Patent: May 17, 2022

(54) GAS DISTRIBUTION ASSEMBLY MOUNTING FOR FRAGILE PLATES TO PREVENT BREAKAGE

(71) Applicant: Applied Materials, Inc., Santa Clara, CA (US)

(72) Inventors: Kevin Griffin, Livermore, CA (US); Guangwei Sun, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/061,844

(22) Filed: Oct. 2, 2020

(65) Prior Publication Data
US 2021/0102291 A1 Apr. 8, 2021

Related U.S. Application Data

(60) Provisional application No. 62/911,201, filed on Oct. 4, 2019.

(51) Int. Cl.
*C23C 16/40* (2006.01)
*C23C 16/455* (2006.01)
*C23C 16/458* (2006.01)

(52) U.S. Cl.
CPC .... *C23C 16/45565* (2013.01); *C23C 16/4584* (2013.01)

(58) Field of Classification Search
CPC .......... C23C 16/45565; C23C 16/4584; C23C 16/45551; F16B 2/00; F16B 23/00
USPC ........................ 118/715; 156/345.33, 345.34
See application file for complete search history.

(56) References Cited

U.S. PATENT DOCUMENTS

| | | | | |
|---|---|---|---|---|
| 4,900,202 A | * | 2/1990 | Wienhold | B23B 31/1071 279/22 |
| 5,013,194 A | * | 5/1991 | Wienhold | B23B 31/1071 279/22 |
| 5,262,029 A | * | 11/1993 | Erskine | C23C 16/4585 118/503 |
| 5,451,290 A | | 9/1995 | Salfelder | |
| 5,845,898 A | * | 12/1998 | Halder | F16B 5/0628 269/48.1 |

(Continued)

FOREIGN PATENT DOCUMENTS

| | | |
|---|---|---|
| KR | 20110058393 A | 6/2011 |
| KR | 20130029938 A | 3/2013 |
| WO | 2004064407 A2 | 7/2004 |

OTHER PUBLICATIONS

PCT International Search Report and Written Opinion in PCT/US2020/053954 dated Mar. 18, 2021, 10 pages.

*Primary Examiner* — Rudy Zervigon
(74) *Attorney, Agent, or Firm* — Servilla Whitney LLC

(57) ABSTRACT

Apparatus and methods for processing substrates using a gas injector unit with a quartz plate are provided. The gas injector unit comprises an injector body with a first opening extending through the injector body. The first opening has a nut portion and a clamp portion. A nut is positioned within the nut portion spaced from the injector body by a spring. A clamp is positioned within the clamp portion, which may be remotely located on a hub for connection with the injector body. A screw extends through the opening in the clamp, a portion of the injector body, the spring and into a connection portion of the nut. Gas distribution assemblies and processing chambers incorporating the gas injector unit are also described.

20 Claims, 9 Drawing Sheets

(56) References Cited

U.S. PATENT DOCUMENTS

| | | | | |
|---|---|---|---|---|
| 6,019,060 A * | | 2/2000 | Lenz | H01J 37/32623 118/723 R |
| 6,910,441 B2 * | | 6/2005 | Jang | C23C 16/45557 118/723 R |
| 7,296,534 B2 * | | 11/2007 | Fink | H01J 37/32532 118/723 E |
| 8,075,690 B2 * | | 12/2011 | Keller | C23C 16/45565 118/715 |
| 8,161,906 B2 * | | 4/2012 | Kadkhodayan | H01J 37/32091 118/723 E |
| 8,163,087 B2 * | | 4/2012 | Faguet | C23C 16/45544 118/715 |
| 8,221,582 B2 * | | 7/2012 | Patrick | H01J 37/3244 156/345.34 |
| 8,272,346 B2 * | | 9/2012 | Bettencourt | H01L 21/67069 118/723 E |
| 8,313,805 B2 * | | 11/2012 | Kadkhodayan | H01J 37/32605 427/248.1 |
| 8,414,719 B2 * | | 4/2013 | Patrick | H01J 37/32541 156/1 |
| 8,536,071 B2 * | | 9/2013 | Bettencourt | H01J 37/32605 438/798 |
| 8,562,266 B2 * | | 10/2013 | Sexton | H01J 37/32807 411/403 |
| 8,573,152 B2 * | | 11/2013 | de la Llera | H01R 13/20 118/723 E |
| 8,628,268 B2 * | | 1/2014 | Kellogg | H01L 21/68728 403/362 |
| 8,632,854 B2 * | | 1/2014 | Park | H01L 21/682 427/282 |
| 8,721,791 B2 * | | 5/2014 | Tiner | C23C 16/45565 118/715 |
| 9,058,960 B2 * | | 6/2015 | Ehrlich | H01J 37/3244 |
| 9,111,968 B2 * | | 8/2015 | Kholodenko | H01J 37/32724 |
| 9,476,120 B2 * | | 10/2016 | Meinhold | H01J 37/32724 |
| 9,550,194 B2 * | | 1/2017 | Hayashi | C23C 16/00 |
| 9,610,591 B2 * | | 4/2017 | Lubomirsky | H01J 37/32183 |
| 9,911,579 B2 * | | 3/2018 | Della Rosa | H01J 37/32807 |
| 10,221,484 B2 * | | 3/2019 | Meinhold | C23C 16/45563 |
| 10,373,810 B2 * | | 8/2019 | Noorbakhsh | H01J 37/32568 |
| 10,378,108 B2 * | | 8/2019 | Wang | C23C 16/4401 |
| 10,584,415 B2 * | | 3/2020 | Meinhold | C23C 16/45563 |
| 10,607,816 B2 * | | 3/2020 | Della Rosa | H01J 37/32807 |
| 10,625,277 B2 * | | 4/2020 | Lubomirsky | H01J 37/32522 |
| 10,745,807 B2 * | | 8/2020 | Wang | C23C 16/45565 |
| 10,790,120 B2 * | | 9/2020 | Della Rosa | H01J 37/3288 |
| 10,886,107 B2 * | | 1/2021 | Noorbakhsh | H01J 37/3244 |
| 2002/0108711 A1 * | | 8/2002 | Kim | C23C 16/45565 156/345.33 |
| 2004/0020429 A1 * | | 2/2004 | Jang | C23C 16/45557 118/715 |
| 2005/0000430 A1 * | | 1/2005 | Jang | C23C 16/45565 118/715 |
| 2005/0011446 A1 * | | 1/2005 | Fink | H01J 37/32458 118/715 |
| 2006/0225655 A1 * | | 10/2006 | Faguet | C23C 16/4401 118/723 R |
| 2014/0246521 A1 | | 9/2014 | Tiner et al. | |
| 2021/0102291 A1 * | | 4/2021 | Griffin | C23C 16/45551 |
| 2021/0146394 A1 * | | 5/2021 | Doering | C23C 16/45565 |

\* cited by examiner

GAS DISTRIBUTION ASSEMBLY MOUNTING FOR FRAGILE PLATES TO PREVENT BREAKAGE

CROSS-REFERENCE TO RELATED APPLICATIONS

This application claims priority to U.S. Provisional Application No. 62/911,201, filed Oct. 4, 2019, the entire disclosure of which is hereby incorporated by reference herein.

TECHNICAL FIELD

The present disclosure relates generally to apparatus and methods for processing a wafer. In particular, the disclosure relates to injector units incorporating mounting hardware that prevents damage due to torque resulting from thermal expansion.

BACKGROUND

Semiconductor device formation is commonly conducted in substrate processing systems or platforms containing batch processing chambers capable of processing multiple wafers at a time. Batch processing is especially beneficial for processes that are too time-consuming to be performed on individual substrates in an economically viable manner, such as for atomic layer deposition (ALD) processes and some chemical vapor deposition (CVD) processes.

Some batch processing chambers use a gas distribution assembly spaced from a susceptor assembly to create a reaction space. The susceptor assembly can be rotated to move a plurality of wafers around the processing chamber. The susceptor assembly is often heated, causing the temperature of the gas distribution assembly to increase. The increase in temperature in some chambers causes the injector units in the gas distribution assembly to change shape. For example, some injector units are known to droop in the center changing the size of the gap between the gas distribution assembly and the susceptor assembly at some locations.

In some batch processing chambers, a quartz liner is mated with an injector unit. At elevated temperatures, the injector unit changes shape, drooping in the center. The shape change causes stress in the quartz liner resulting in breakage if the quartz liner and injector are bolted together tightly. If the quartz liner is mated too loosely to the injector, the flow leakage through the gap between two components can compromise the process.

Therefore, there is a need in the art for apparatus and methods of mitigating torque related breakage of quartz liners coupled to injector units at elevated temperatures.

SUMMARY

One or more embodiments of the disclosure are directed to gas injector units comprising an injector body and a quartz plate. The injector body has a front surface and back surface defining a thickness. The front surface has a plurality of apertures extending into the injector body to allow a flow of gas from within the injector body to exit through the front surface. The quartz plate has a front surface and a back surface. The back surface of the quartz plate is positioned adjacent the front surface of the injector body. The quartz plate has a plurality of apertures to allow a flow of gas to pass through the quartz plate. A first opening extends from the back surface to the front surface of the injector body. The first opening has a nut portion adjacent the back surface and a clamp portion adjacent the front surface. A first nut is located within the nut portion of the first opening. A first clamp is located within the clamp portion of the first opening. The first clamp has a clamp body with an opening therethrough and a support surface extending a distance from the clamp body. The support surface is in contact with an edge of the quartz plate. A first spring is located within the nut portion of the first opening between the first nut and the injector body. A first screw extends through the opening in the first clamp, a portion of the injector body, the first spring and into a connection portion of the first nut.

Additional embodiments of the disclosure are directed to gas distribution assemblies comprising a central hub and a plurality of injector units arranged around the central hub. The central hub has at least one opening therethrough with a clamp portion adjacent a bottom surface of the hub. The injector body has a front surface and a back surface defining a thickness. The front surface has a plurality of apertures extending into the injector body to allow a flow of gas from within the injector body to exit through the front surface. A first opening extends from the back surface to the front surface of the injector body. The first opening has a nut portion adjacent the back surface and a clamp portion adjacent the front surface. A quartz plate has a front surface and a back surface. The back surface of the quartz plate is positioned adjacent the front surface of the injector body. The quartz plate has a plurality of apertures to allow a flow of gas to pass through the quartz plate. A first nut is located within the nut portion of the first opening. A first clamp is located within the clamp portion of the first opening. The first clamp has a clamp body with an opening therethrough and a support surface extending a distance from the clamp body. The support surface is in contact with an edge of the quartz plate. A first spring is located within the nut portion of the first opening between the first nut and the injector body. A first screw extends through the opening in the first clamp, a portion of the injector body, the first spring and into a connection portion of the first nut. A second opening extends from the back surface to the front surface of the injector body aligned with the opening in the central hub. The second opening has a nut portion adjacent the back surface of the injector body. A second nut is located within the nut portion of the second opening. A second spring is located within the nut portion of the second opening between the second nut and the injector body. A second clamp is located within the clamp portion of the central hub. The second clamp has a clamp body with an opening therethrough and a support surface extending a distance from the clamp body. The support surface is in contact with an edge of the quartz plate. A second screw extends through the opening in the second clamp, the central hub, a portion of the injector body, the second spring and into a connection portion of the second nut.

Further embodiments of the disclosure are directed to processing chambers comprising a gas distribution assembly and a susceptor assembly. The gas distribution assembly comprises a central hub and a plurality of injector units arranged around the central hub. The central hub has at least one opening therethrough with a clamp portion adjacent a bottom surface of the hub. The injector body has a front surface and a back surface defining a thickness. The front surface has a plurality of apertures extending into the injector body to allow a flow of gas from within the injector body to exit through the front surface. A first opening extends from the back surface to the front surface of the injector body. The first opening has a nut portion adjacent the back surface and a clamp portion adjacent the front surface. A quartz plate has a front surface and a back surface. The back surface of the quartz plate is positioned adjacent the front surface of the injector body. The quartz plate has a plurality of apertures to allow a flow of gas to pass through the quartz plate. A first nut is located within the nut portion of the first opening. A first clamp is located within the clamp portion of the first opening. The first clamp has a clamp body with an opening therethrough and a support surface extending a distance from the clamp body. The support surface is in contact with an edge of the quartz plate. A first spring is located within the nut portion of the first opening between the first nut and the injector body. A first screw extends through the opening in the first clamp, a portion of the injector body, the first spring and into a connection portion of the first nut. A second opening extends from the back surface to the front surface of the injector body aligned with the opening in the central hub. The second opening has a nut portion adjacent the back surface of the injector body. A second nut is located within the nut portion of the second opening. A second spring is located within the nut portion of the second opening between the second nut and the injector body. A second clamp is located within the clamp portion of the central hub. The second clamp has a clamp body with an opening therethrough and a support surface extending a distance from the clamp body. The support surface is in contact with an edge of the quartz plate. A second screw extends through the opening in the second clamp, the central hub, a portion of the injector body, the second spring and into a connection portion of the second nut. The susceptor assembly comprises a susceptor having a top surface with a plurality of recesses formed therein to support a plurality of wafers and rotate the plurality of wafers around a central axis of the susceptor assembly so that the wafers are a distance from the front face of the quartz plate on the injector unit.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface, or with a film formed on the substrate surface.

Figure 1:
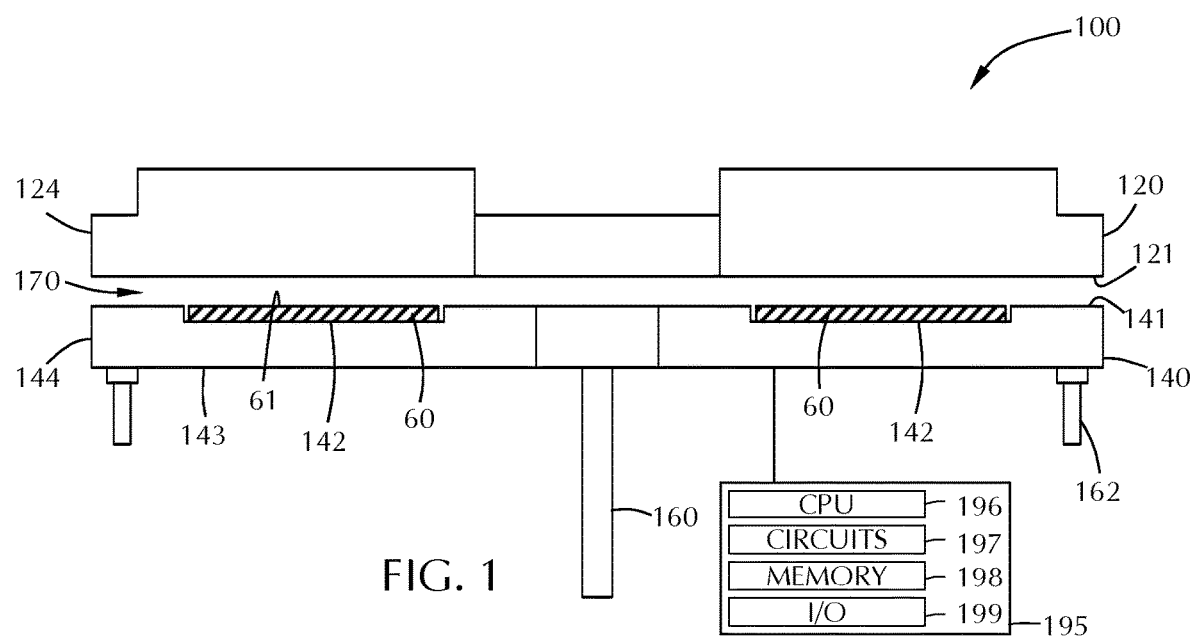
FIG. 1 shows a cross-sectional view of a batch processing chamber in accordance with one or more embodiment of the disclosure.

Some embodiments of the disclosure are directed to batch processing chamber, also referred to as a spatial processing chamber. FIG. 1 shows a cross-section of a processing chamber 100 including a gas distribution assembly 120, also referred to as injectors or an injector assembly, and a susceptor assembly 140. The gas distribution assembly 120 is any type of gas delivery device used in a processing chamber. The gas distribution assembly 120 includes a front surface 121 which faces the susceptor assembly 140. The front surface 121 can have any number or variety of openings to deliver a flow of gases toward the susceptor assembly 140. The gas distribution assembly 120 also includes an outer edge 124 which in the embodiments shown, is substantially round.

The specific type of gas distribution assembly 120 used can vary depending on the particular process being used. Embodiments of the disclosure can be used with any type of processing system where the gap between the susceptor and the gas distribution assembly is controlled. In a binary reaction, the plurality of gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the wafer. Some of the gas flow moves horizontally across the surface of the wafer and out of the processing region through the purge gas P channel(s).

Figure 2:
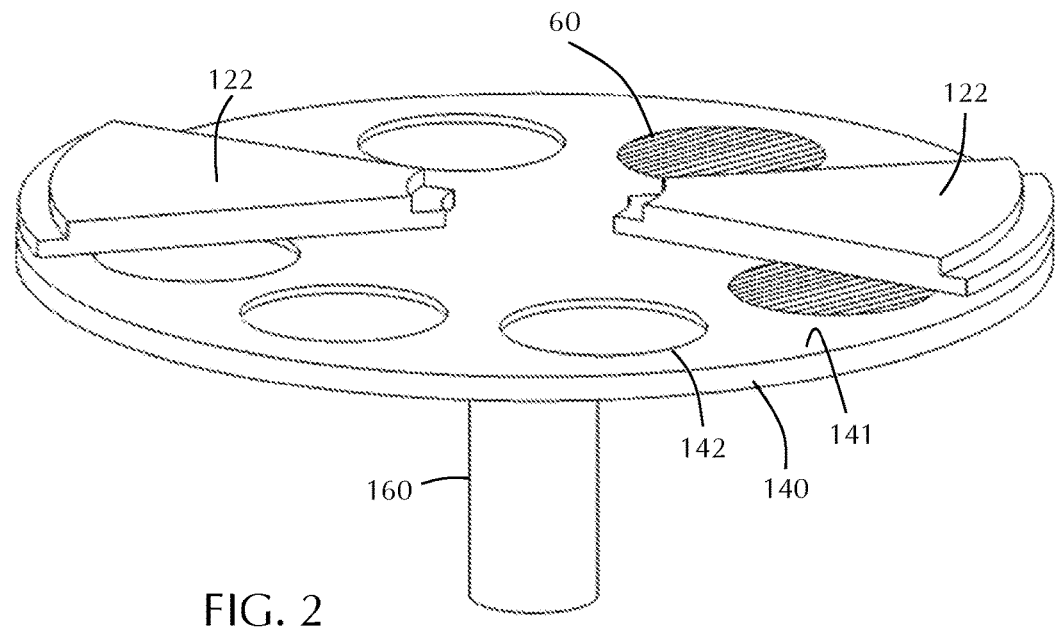
FIG. 2 shows a partial perspective view of a batch processing chamber in accordance with one or more embodiment of the disclosure.

In some embodiments, the gas distribution assembly 120 is a rigid stationary body made of a single injector unit. In one or more embodiments, the gas distribution assembly 120 is made up of a plurality of individual sectors (e.g., injector units 122), as shown in FIG. 2. Either a single piece body or a multi-sector body can be used with the various embodiments of the disclosure described.

A susceptor assembly 140 is positioned beneath the gas distribution assembly 120. The susceptor assembly 140 includes a top surface 141 and at least one recess 142 in the top surface 141. The susceptor assembly 140 also has a bottom surface 143 and an edge 144. The recess 142 can be any suitable shape and size depending on the shape and size of the substrates 60 being processed. In the embodiment shown in FIG. 1, the recess 142 has a flat bottom to support the bottom of the wafer; however, the bottom of the recess can vary. In some embodiments, the recess has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In some embodiments, as shown in FIG. 1, the recess 142 in the top surface 141 of the susceptor assembly 140 is sized so that a substrate 60 supported in the recess 142 has a top surface 61 substantially coplanar with the top surface 141 of the susceptor 140. As used in this specification and the appended claims, the term "substantially coplanar" means that the top surface of the wafer and the top surface of the susceptor assembly are coplanar within ±0.2 mm. In some embodiments, the top surfaces are coplanar within ±0.15 mm, ±0.10 mm or ±0.05 mm.

The susceptor assembly 140 of FIG. 1 includes a support post 160 which is capable of lifting, lowering and rotating the susceptor assembly 140. The susceptor assembly may include a heater, or gas lines, or electrical components within the center of the support post 160. The support post 160 may be the primary means of increasing or decreasing the gap between the susceptor assembly 140 and the gas distribution assembly 120, moving the susceptor assembly 140 into proper position. The susceptor assembly 140 may also include fine tuning actuators 162 which can make micro-adjustments to susceptor assembly 140 to create a predetermined gap 170 between the susceptor assembly 140 and the gas distribution assembly 120.

In some embodiments, the gap 170 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The processing chamber 100 shown in the Figures is a carousel-type chamber in which the susceptor assembly 140 can hold a plurality of substrates 60. As shown in FIG. 2, the gas distribution assembly 120 may include a plurality of separate injector units 122, each injector unit 122 being capable of depositing a film on the wafer, as the wafer is moved beneath the injector unit. Two pie-shaped injector units 122 are shown positioned on approximately opposite sides of and above the susceptor assembly 140. This number of injector units 122 is shown for illustrative purposes only. It will be understood that more or less injector units 122 can be included. In some embodiments, there are a sufficient number of pie-shaped injector units 122 to form a shape conforming to the shape of the susceptor assembly 140. In some embodiments, each of the individual pie-shaped injector units 122 may be independently moved, removed and/or replaced without affecting any of the other injector units 122. For example, one segment may be raised to permit a robot to access the region between the susceptor assembly 140 and gas distribution assembly 120 to load/unload substrates 60.

Figure 3:
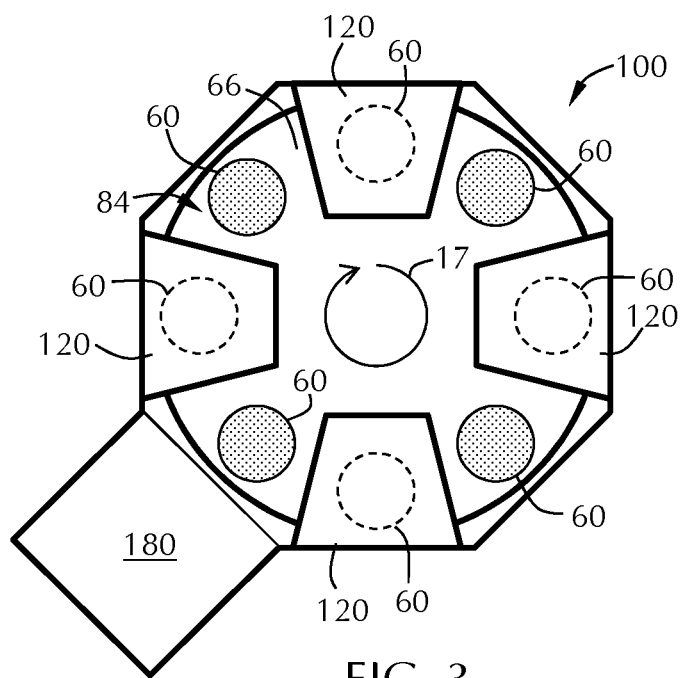
FIG. 3 shows a schematic view of a batch processing chamber in accordance with one or more embodiment of the disclosure.

Processing chambers having multiple gas injectors can be used to process multiple wafers simultaneously so that the wafers experience the same process flow. For example, as shown in FIG. 3, the processing chamber 100 has four gas injector assemblies and four substrates 60. At the outset of processing, the substrates 60 can be positioned between the injector assemblies 30. Rotating 17 the susceptor assembly 140 by 45° will result in each substrate 60 which is between gas distribution assemblies 120 to be moved to an gas distribution assembly 120 for film deposition, as illustrated by the dotted circle under the gas distribution assemblies 120. An additional 45° rotation would move the substrates 60 away from the injector assemblies 30. The number of substrates 60 and gas distribution assemblies 120 can be the same or different. In some embodiments, there are the same numbers of wafers being processed as there are gas distribution assemblies. In one or more embodiments, the number of wafers being processed are fraction of or an integer multiple of the number of gas distribution assemblies. For example, if there are four gas distribution assemblies, there are 4× wafers being processed, where x is an integer value greater than or equal to one. In an exemplary embodiment, the gas distribution assembly 120 includes eight processing regions separated by gas curtains and the susceptor assembly 140 can hold six wafers.

The processing chamber 100 shown in FIG. 3 is merely representative of one possible configuration and should not be taken as limiting the scope of the disclosure. Here, the processing chamber 100 includes a plurality of gas distribution assemblies 120. In the embodiment shown, there are four gas distribution assemblies (also called injector assemblies 30) evenly spaced about the processing chamber 100. The processing chamber 100 shown is octagonal; however, those skilled in the art will understand that this is one possible shape and should not be taken as limiting the scope of the disclosure. The gas distribution assemblies 120 shown are trapezoidal, but can be a single circular component or made up of a plurality of pie-shaped segments, like that shown in FIG. 2.

The embodiment shown in FIG. 3 includes a load lock chamber 180, or an auxiliary chamber like a buffer station. This chamber 180 is connected to a side of the processing chamber 100 to allow, for example the substrates (also referred to as substrates 60) to be loaded/unloaded from the chamber 100. A wafer robot may be positioned in the chamber 180 to move the substrate onto the susceptor.

Rotation of the carousel (e.g., the susceptor assembly 140) can be continuous or intermittent (discontinuous). In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where the carousel can pause again. Pausing between the injectors may provide time for additional processing between each layer deposition (e.g., exposure to plasma).

Figure 4:
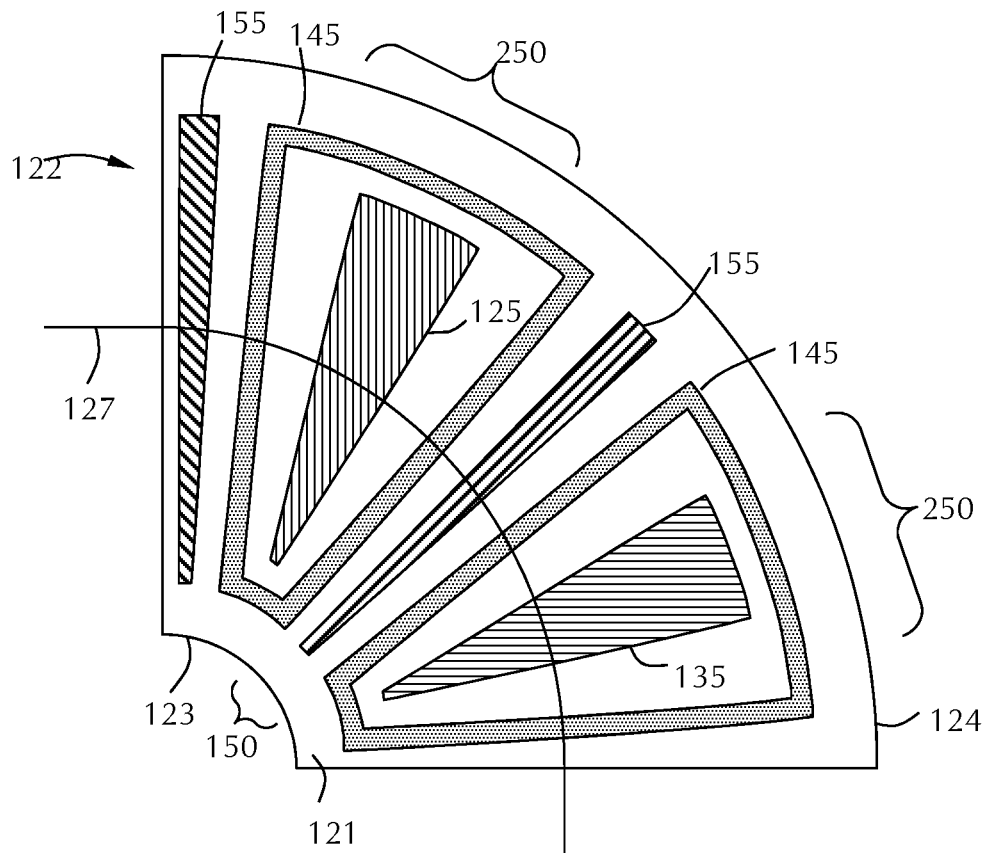
FIG. 4 shows a schematic view of a portion of a wedge shaped gas distribution assembly for use in a batch processing chamber in accordance with one or more embodiment of the disclosure.
Figure 5:
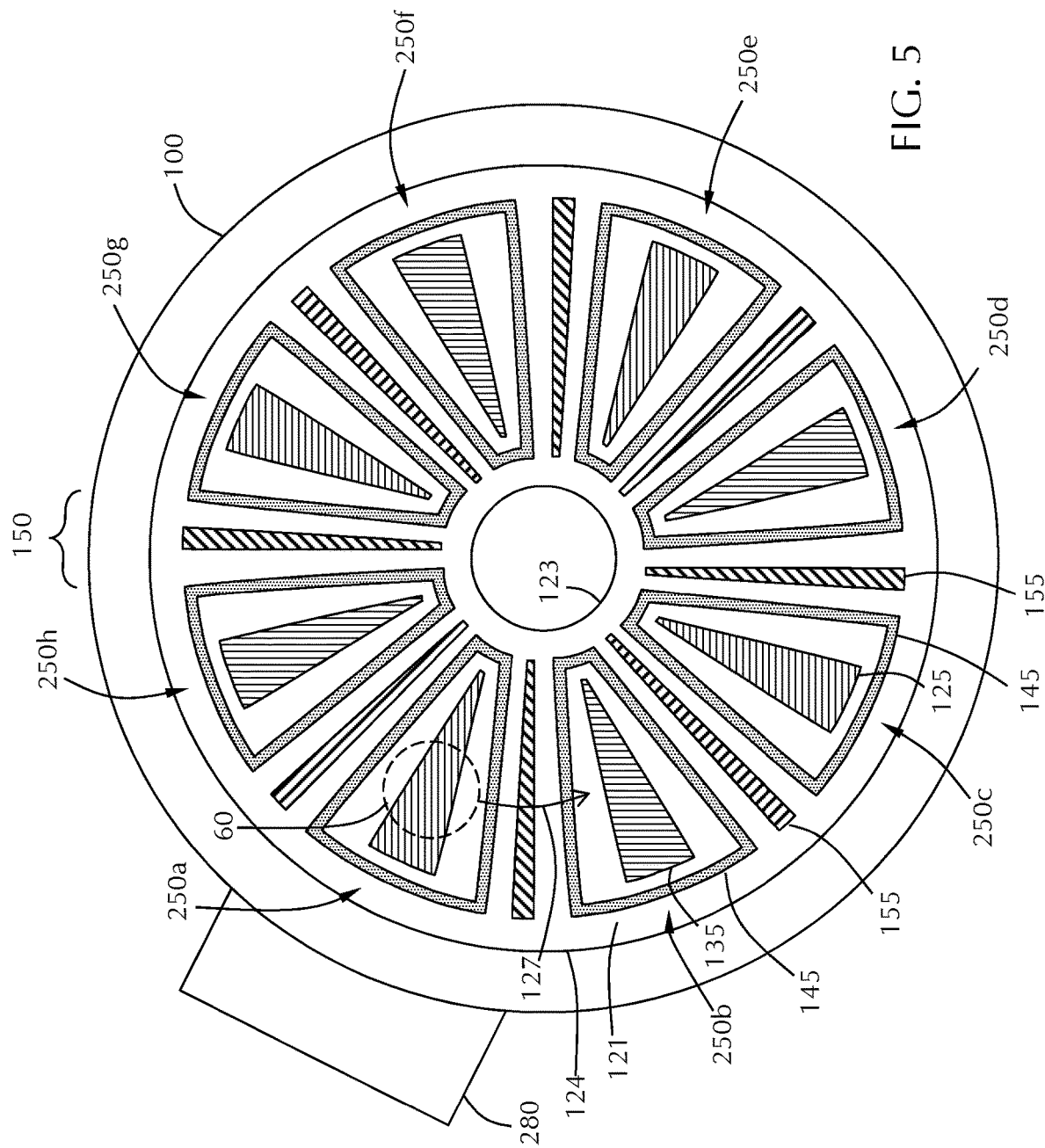
FIG. 5 shows a schematic view of a batch processing chamber in accordance with one or more embodiments of the disclosure.

FIG. 4 shows a sector or portion of a gas distribution assembly 220, which may be referred to as an injector unit 122. The injector units 122 can be used individually or in combination with other injector units. For example, as shown in FIG. 5, four of the injector units 122 of FIG. 4 are combined to form a single gas distribution assembly 220. (The lines separating the four injector units are not shown for clarity.) While the injector unit 122 of FIG. 4 has both a first reactive gas port 125 and a second gas port 135 in addition to purge gas ports 155 and vacuum ports 145, an injector unit 122 does not need all of these components.

Referring to both FIGS. 4 and 5, a gas distribution assembly 220 in accordance with one or more embodiment may comprise a plurality of sectors (or injector units 122) with each sector being identical or different. The gas distribution assembly 220 is positioned within the processing chamber and comprises a plurality of elongate gas ports 125, 135, 155 and elongate vacuum ports 145 in a front surface 121 of the gas distribution assembly 220. The plurality of elongate gas ports 125, 135, 155 and elongate vacuum ports 145 extend from an area adjacent the inner peripheral edge 123 toward an area adjacent the outer peripheral edge 124 of the gas distribution assembly 220. The plurality of gas ports shown include a first reactive gas port 125, a second gas port 135, a vacuum port 145 which surrounds each of the first reactive gas ports and the second reactive gas ports and a purge gas port 155.

With reference to the embodiments shown in FIG. 4 or 5, when stating that the ports extend from at least about an inner peripheral region to at least about an outer peripheral region, however, the ports can extend more than just radially from inner to outer regions. The ports can extend tangentially as vacuum port 145 surrounds reactive gas port 125 and reactive gas port 135. In the embodiment shown in FIGS. 4 and 5, the wedge shaped reactive gas ports 125, 135 are surrounded on all edges, including adjacent the inner peripheral region and outer peripheral region, by a vacuum port 145.

Referring to FIG. 4, as a substrate moves along path 127, each portion of the substrate surface is exposed to the various reactive gases. To follow the path 127, the substrate will be exposed to, or "see", a purge gas port 155, a vacuum port 145, a first reactive gas port 125, a vacuum port 145, a purge gas port 155, a vacuum port 145, a second gas port 135 and a vacuum port 145. Thus, at the end of the path 127 shown in FIG. 4, the substrate has been exposed to the first gas port 125 and the second gas port 135 to form a layer. The injector unit 122 shown makes a quarter circle but could be larger or smaller. The gas distribution assembly 220 shown in FIG. 5 can be considered a combination of four of the injector units 122 of FIG. 4 connected in series.

The injector unit 122 of FIG. 4 shows a gas curtain 150 that separates the reactive gases. The term "gas curtain" is used to describe any combination of gas flows or vacuum that separate reactive gases from mixing. The gas curtain 150 shown in FIG. 4 comprises the portion of the vacuum port 145 next to the first reactive gas port 125, the purge gas port 155 in the middle and a portion of the vacuum port 145 next to the second gas port 135. This combination of gas flow and vacuum can be used to prevent or minimize gas phase reactions of the first reactive gas and the second reactive gas.

Referring to FIG. 5, the combination of gas flows and vacuum from the gas distribution assembly 220 form a separation into a plurality of processing regions 250. The processing regions are roughly defined around the individual gas ports 125, 135 with the gas curtain 150 between 250. The embodiment shown in FIG. 5 makes up eight separate processing regions 250 with eight separate gas curtains 150 between. A processing chamber can have at least two processing region. In some embodiments, there are at least three, four, five, six, seven, eight, nine, 10, 11 or 12 processing regions.

During processing a substrate may be exposed to more than one processing region 250 at any given time. However, the portions that are exposed to the different processing regions will have a gas curtain separating the two. For example, if the leading edge of a substrate enters a processing region including the second gas port 135, a middle portion of the substrate will be under a gas curtain 150 and the trailing edge of the substrate will be in a processing region including the first reactive gas port 125.

A factory interface 280, which can be, for example, a load lock chamber, is shown connected to the processing chamber 100. A substrate 60 is shown superimposed over the gas distribution assembly 220 to provide a frame of reference. The substrate 60 may often sit on a susceptor assembly to be held near the front surface 121 of the gas distribution assembly 120. The substrate 60 is loaded via the factory interface 280 into the processing chamber 100 onto a substrate support or susceptor assembly (see FIG. 3). The substrate 60 can be shown positioned within a processing region because the substrate is located adjacent the first reactive gas port 125 and between two gas curtains 150a, 150b. Rotating the substrate 60 along path 127 will move the substrate counter-clockwise around the processing chamber 100. Thus, the substrate 60 will be exposed to the first processing region 250a through the eighth processing region 250h, including all processing regions between.

As shown in FIG. 1, a controller 395 may be provided and coupled to various components of the processing chamber 100 to control the operation thereof. The controller 195 can be a single controller that controls the entire processing chamber 100, or multiple controllers that control individual portions of the processing chamber 100. In some embodiments, the controller 195 includes a central processing unit (CPU) 196, support circuits 197, memory 198, and an input/output (I/O) 199. The controller 195 may control the processing chamber 100 directly, or via computers (or controllers) associated with particular process chamber and/ or support system components. The controller 195 may be one of any form of general-purpose computer processor that can be used in an industrial setting for controlling various chambers and sub-processors. The memory 198 or computer readable medium of the controller 195 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 197 are coupled to the CPU 196 for supporting the processor in a conventional manner. These circuits include cache, power supplies, clock circuits, input/output circuitry and subsystems, and the like. One or more processes may be stored in the memory 198 as software routine that may be executed or invoked to control the operation of the processing chamber 100 or individual processing chambers in the manner described herein. The software routine may also be stored and/or executed by a second CPU (not shown) that is remotely located from the hardware being controlled by the CPU 196. The input/output 199 can include keyboards, computer mice, displays and/or printers.

In some embodiments, a controller is coupled to the susceptor assembly and the gas distribution assembly. The controller has one or more configurations to control the various functions and processes. In some embodiments, the configurations are selected from a first configuration to rotate the susceptor assembly about the central axis, a second configuration to provide a flow of gas into the injector unit, and a third configuration to heat the susceptor assembly.

The gas injector units of some embodiments include a quartz plate (also referred to as a quartz liner) attached to the front surface of the injector body. At processing temperatures, the injector unit of some embodiments droops in the center resulting in excess stress in the quartz liner and breakage if the quartz liner is connected too tightly to the injector. Loosening the connection between the quartz liner and the injector unit may reduce stress related breakage but can also allow process gases to flow around the quartz liner, rather than through the liner, compromising the process.

One or more embodiments of the disclosure are directed to apparatus and methods providing compliance to mitigate the torque related breakage due to injector drooping while maintaining close contact with the injector. In some embodiments, springs positioned between mounting hardware absorb excess torque caused by drooping while maintaining sufficient clamping force. In some embodiments, springs are used to mount hardware for compliance to dynamically adjust to changes in the shape of the injector unit.

In some embodiments, fragile parts (e.g., quartz plates) are clamped with a mating part (e.g., an injector plate or injector body) by a flexible fastener assembly. In some embodiments, the fragile parts are connected to the mating part at three locations. The flexible fastener assembly of some embodiments comprises a shoulder screw, a spring and an anti-rotation nut. The spring of some embodiments sits in a counterbored hole in the injector plate and the nut sits on the spring with the threaded opening facing down. The shoulder screw goes through the bolt holes in the quartz plate and the injector plate and can be engaged with the nut. As the screw is tightened, the spring compresses from the relaxed state to a compressed state until the screw should hits the nut. At this point, the quartz plate sits on the heads of the screws. The shoulder provides a hard stop to prevent the spring from being over-tightened. The length of the shoulder is determined so that the spring is compressed sufficiently to hold the quartz plate while leaving a margin for further compression when the injector plate is deformed. When the injector plate is dropping, the center of the quartz plate is pushed down and the ends are pulled up. Due to the compliance of the spring of some embodiments, the deformation of the injector plate is absorbed by the spring partially and the stress in the quartz plate is mitigated to remain below the breakage point.

Figure 6:
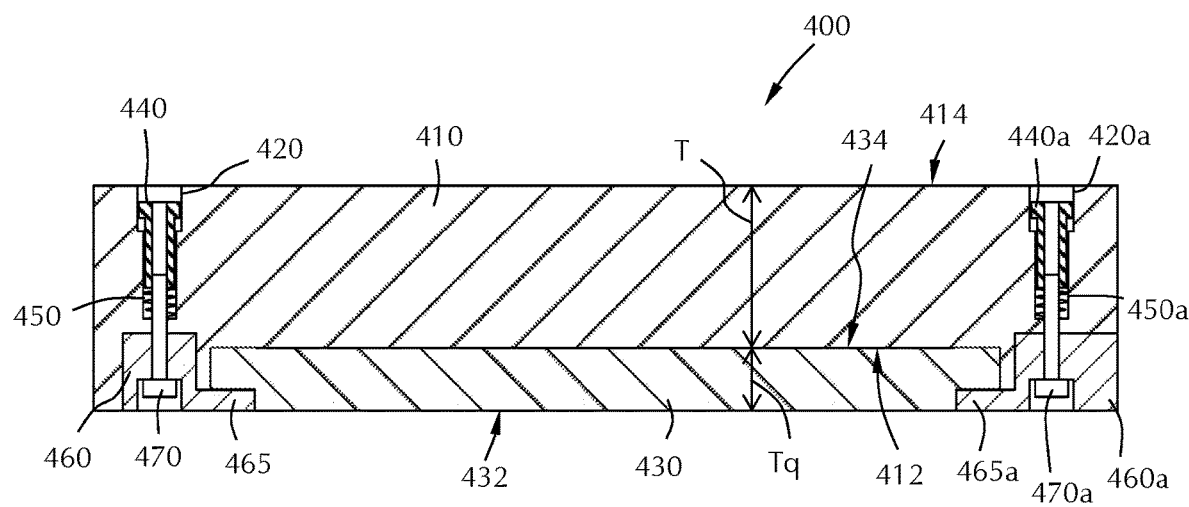
FIG. 6 shows a schematic cross-sectional view of a gas injector unit according to one or more embodiment of the disclosure.
Figure 7:
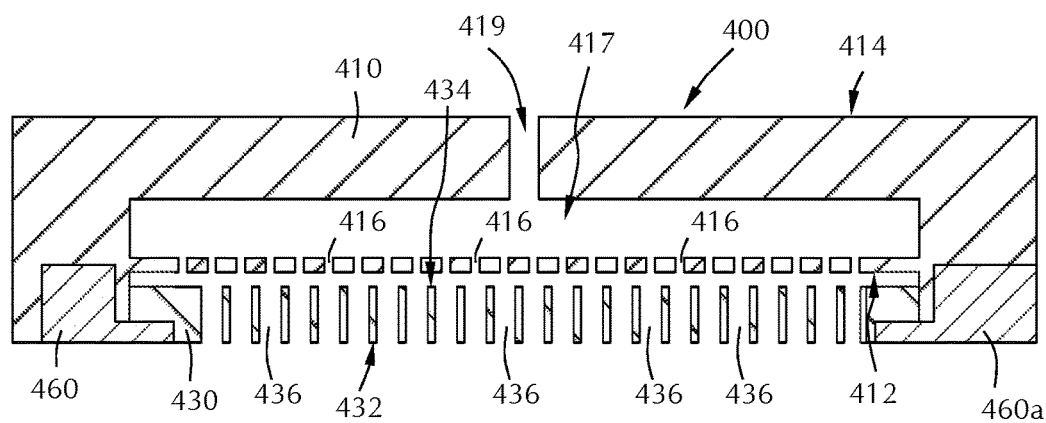
FIG. 7 shows a schematic cross-sectional view of a gas injector unit according to one or more embodiment of the disclosure.

Referring to FIGS. 6 through 13, one or more embodiments of the disclosure are directed to gas injector units 400. The injector units 400 comprise an injector body 410 having a front surface 412 and a back surface 414 defining a thickness T. The injector body 410 has a plurality of apertures 416 extending into the injector body 410 to allow a flow of gas from within the injector body to exit through the front surface 412. As shown in FIG. 7, some embodiments of the injector body include a plenum 417 within the interior of the body 410. The plenum 417 of some embodiments is in fluid communication with a gas source (not shown) through an inlet 419.

A first opening 420 extends from the back surface 414 to the front surface 412 of the injector body. The terms first, second, third, etc., used herein are intended to refer to a component or group of components and should not be taken as limiting the scope to a particular number of components. For example, the first opening 420 may be only opening.

The first opening 420 of some embodiments includes a nut portion 424 adjacent the back surface 414 and a clamp portion 422 adjacent the front surface 412. In the embodiment illustrated in FIG. 8, the opening 420 has four distinct sections: the nut portion 424 is a larger top nut portion 414*a* and a narrower bottom nut portion 414*b*; the clamp portion 422 and an intermediate portion 423 connecting the clamp portion 422 and the nut portion 414. The skilled artisan will recognize that the opening 420 can have more or less than four distinct sections.

Figure 8:
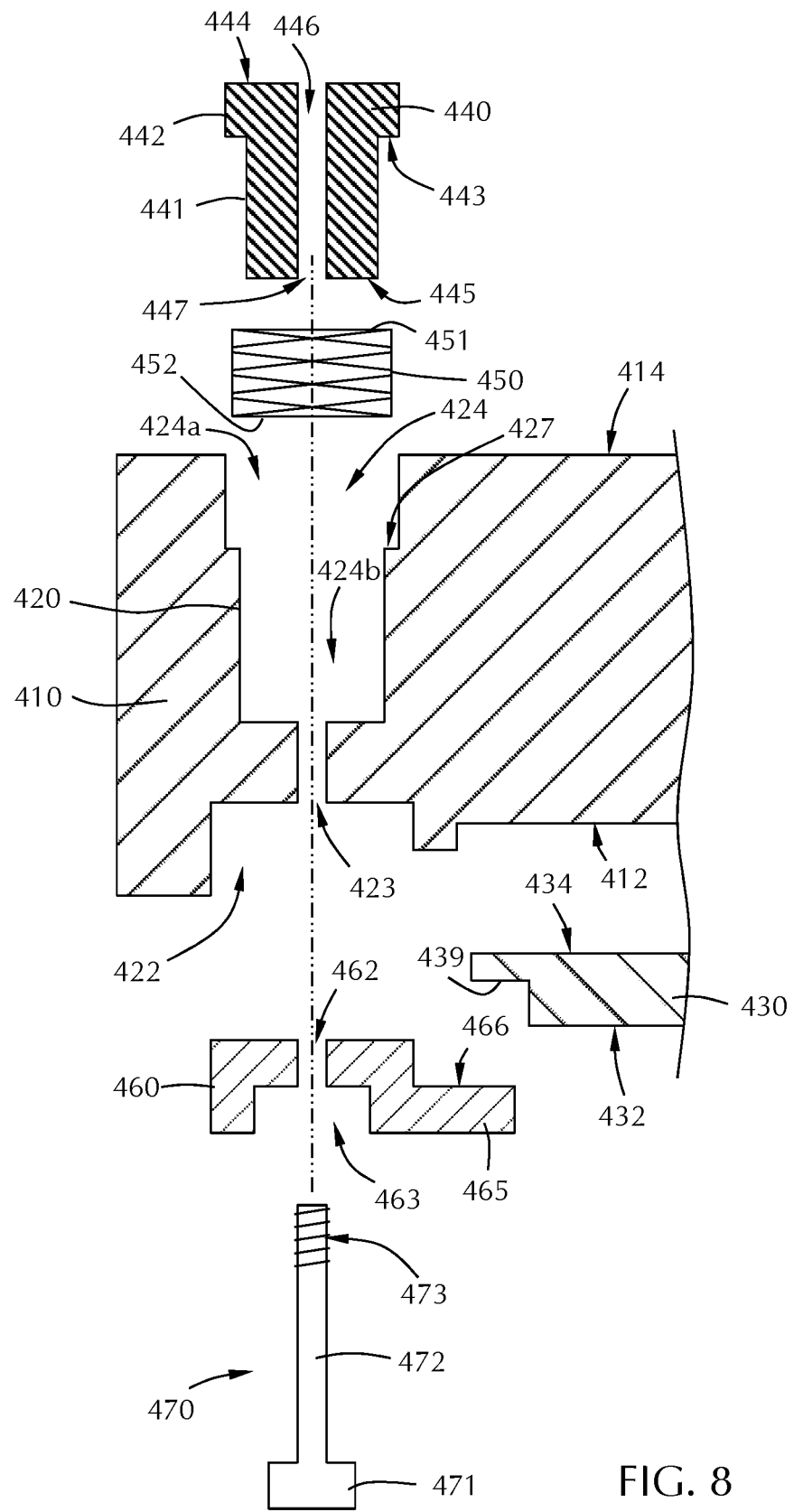
FIG. 8 shows an exploded partial schematic cross-sectional view of a gas injector unit according to one or more embodiment of the disclosure.
Figure 9:
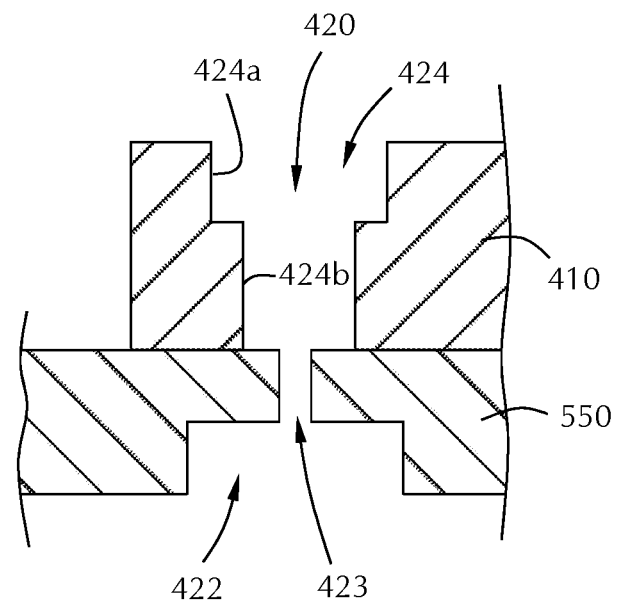
FIG. 9 shows a partial schematic cross-sectional view of a gas injector unit and central hub according to one or more embodiment of the disclosure.

In the embodiment illustrated in FIG. 8, the entire first opening 420 is located within the injector body 410. Referring to FIG. 9, as will be described further below, in some embodiments, the opening 420 has a portion in the injector body 410 and a portion in a separate component, for example, hub 550.

A quartz plate 430 is attached to, or in contact with, the front surface 412 of the injector body 410. The quartz plate 430 has a front surface 432 and a back surface 434 defining a thickness Tq of the quartz plate 430. The thickness Tq of the quartz plate of some embodiments is in the range of about 5 mm to about 25 mm, or in the range of about 10 mm to about 20 mm, or about 15 mm.

The back surface 434 of the quartz plate 430 is positioned adjacent to the front surface 412 of the injector body 410 so that a gap 435 is formed. The quartz plate 430 has a plurality of apertures 436 extending through the quartz plate 430 to allow a flow of gas to pass through the quartz plate 430. For example, a flow of gas can enter the injector body 410 through inlet 419 to fill plenum 417. The gas can pass from plenum 417, through apertures 416 into gap 435 and then through apertures 436 to exit the front surface 432 of the quartz plate 430.

A first nut 440 is located within the nut portion 424 of the first opening 420. Referring to FIG. 8, the first nut 440 of some embodiments includes a top portion 441 and a bottom portion 442 having a different cross-sectional size, area and/or shape. For example, the size of the top portion 441 illustrated in FIG. 8 is greater than the bottom portion 442 creating a ledge 443. The ledge 443 of some embodiments is configured to interact with surface 427 of the first opening 420 to prevent the first nut 440 from moving too far in the first opening 420, acting as a hard stop.

The first nut 440 has a top surface 444 and a bottom surface 445. In some embodiments, the first nut 440 has an opening 446 that extends between the top surface 444 and the bottom surface 445. The opening 446 of some embodiments includes a connection portion 447 adjacent the bottom surface 445. In some embodiments, the connection portion 447 comprises one or more screw threads.

Figure 10A:
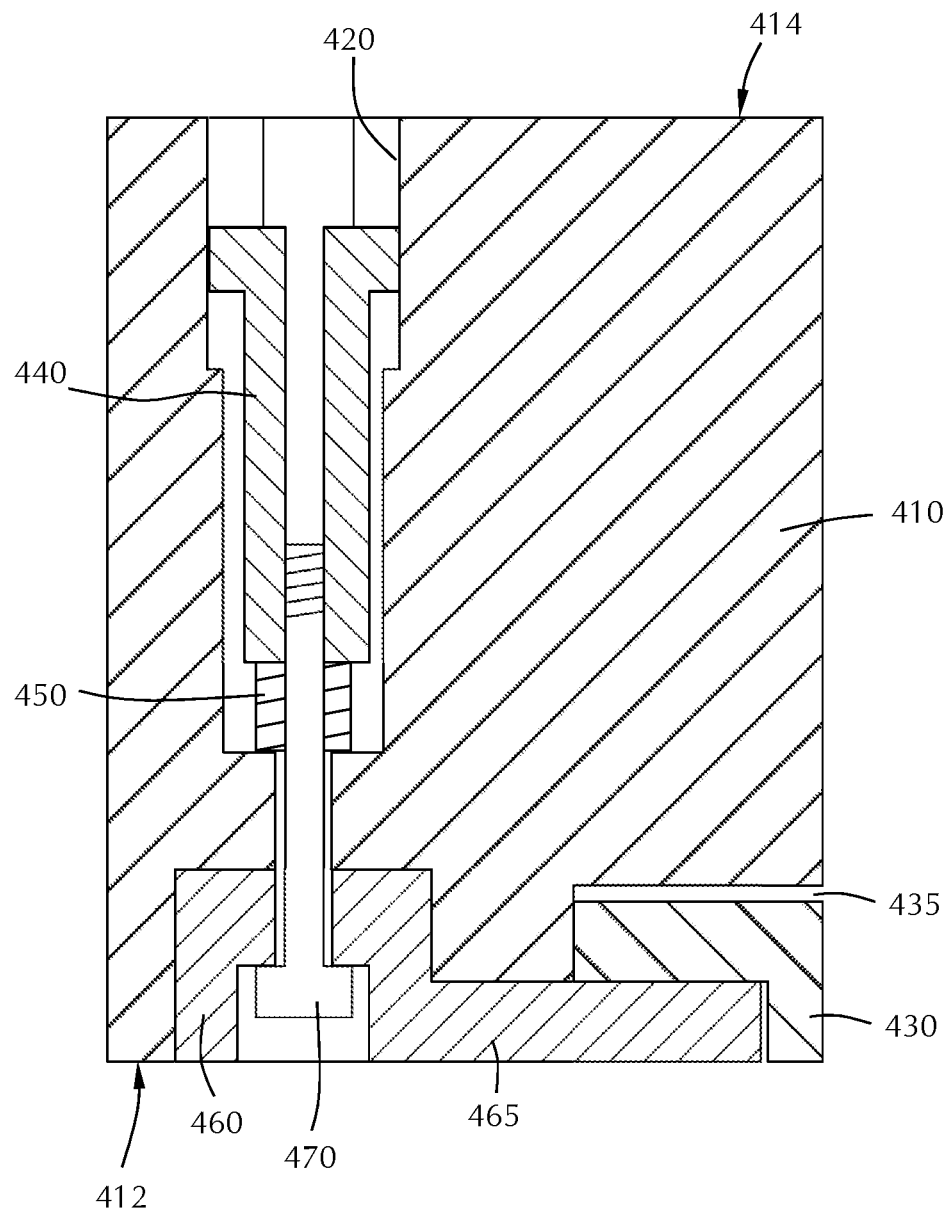
FIG. 10A shows a partial schematic cross-sectional view of a gas injector unit according to one or more embodiment of the disclosure in a relaxed state.
Figure 10B:
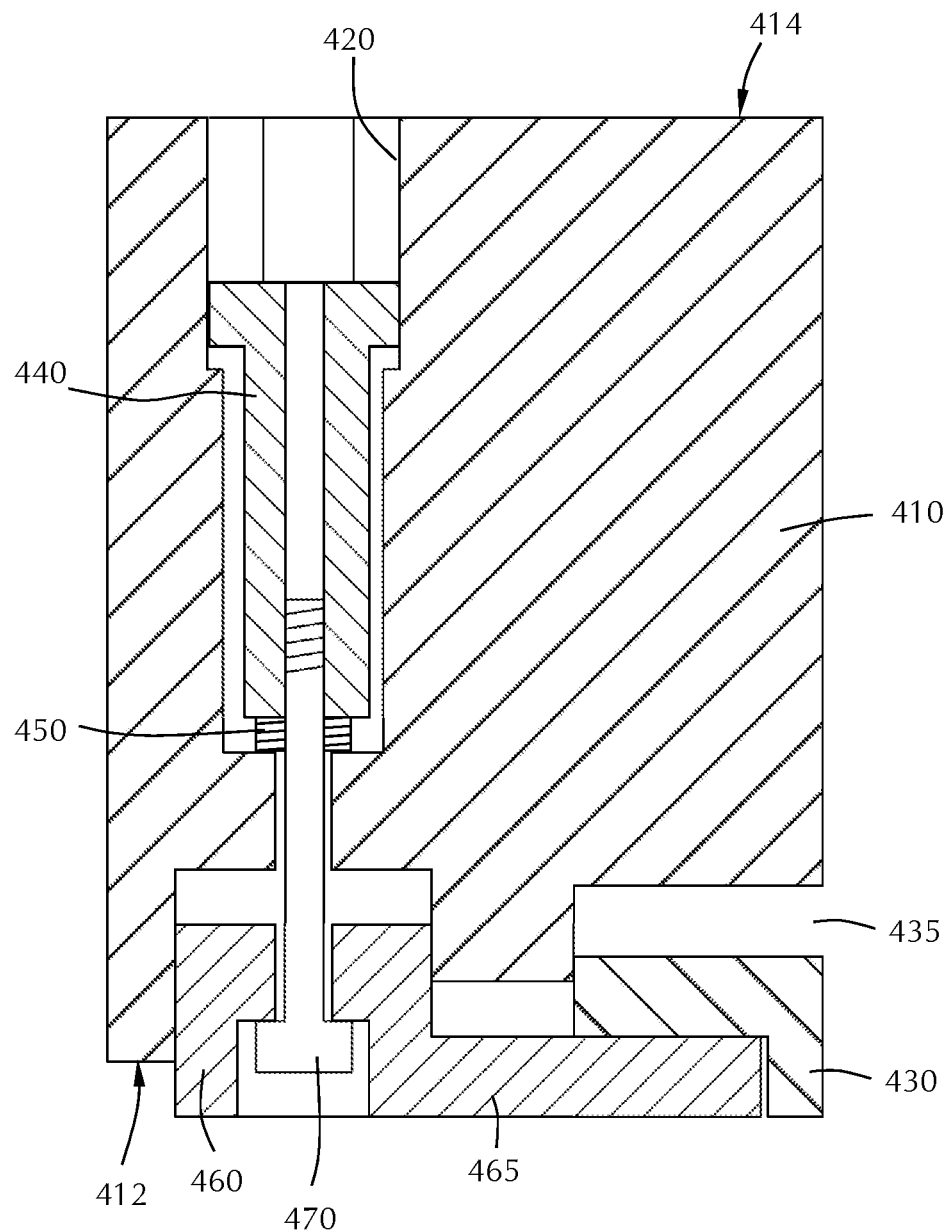
FIG. 10B shows the gas injector unit of FIG. 10A in a compressed state.

In some embodiments, the first nut 440 comprises an anti-rotation nut. In some embodiments, the nut portion 424 of the opening 420, and the first nut 440 have complementary shapes that restrict rotational movement of the first nut 440 within the first opening 420. For example, the nut portion 424 of the opening 420 of some embodiments has a hexagonal cross-section (as shown in FIGS. 10A and 10B) and the first nut 440 has a hexagonal cross-section that is sized to fit within the opening without allowing more than a minimal amount of rotation. In some embodiments, the nut portion of the opening and the first nut have octagonal, heptagonal, pentagonal, quadrilateral, triangular, oblong or t-shaped cross-sections.

Referring back to FIG. 8, a first spring 450 is located within the nut portion 424 of the first opening 420. The first spring 450 of some embodiments is positioned between the first nut 440 and the injector body 410. The first spring 450 moves between a relaxed state (see FIG. 10A) and a compressed state (see FIG. 10B) during movement of the quartz plate 430.

In some embodiments, the bottom surface 445 of the first nut 440 contacts the top 451 of the first spring 450. The bottom 452 of the first spring 450 contacts the injector body 410. In some embodiments, the first spring 450 prevents the bottom surface 445 of the first nut 440 from contacting the injector body 410. The first spring 450 of some embodiments is a wave spring.

A first clamp 460 is located within the clamp portion 422 of the first opening 420. The first clamp 460 of some embodiments has a clamp body 461 and an extension arm 465. The clamp body 461 of some embodiments has an opening 462 extending therethrough. In some embodiments, the extension arm 465 includes a support surface 466 extending a distance from the clamp body 461. The support surface 466 of some embodiments contacts an edge 439 of the quartz plate 430 and provides an interference fit (or friction connection).

In some embodiments, a first screw 470 has a head 471 with an elongate shaft 472 extending from the head 471. The elongate shaft 472 of some embodiments has a threaded portion 473 at the end of the elongate shaft 471 opposite the head 471. In some embodiments, the head 471 of the first screw 470 is within a recess 463 in the bottom surface of the first clamp 460 and the elongate shaft 472 extends through the opening 462 in the first clamp 460, a portion of the injector body (intermediate portion 423), the first spring 450 and into a connection portion 447 of the first nut 440. In some embodiments, the threaded portion 473 of the first screw 470 is screwed into the connection portion 447 of the first nut 440.

With reference to FIGS. 10A and 10B, the operation of the injector unit 400 is now described. FIG. 10A shows an embodiment of the injector unit 400 in the relaxed or low temperature state. FIG. 10B shows the injector unit 400 of FIG. 10A in a compressed or high temperature state. In the relaxed state shown in FIG. 10A, the first spring 450 is expanded, the first clamp 460 is fully within the clamp portion 422 of the opening 420. The extension arm 465 supports the quartz plate 430 in a position with minimal or no gap 435 between the quartz plate 430 and the injector body 410. After the temperature of the injector unit 400 is elevated, as shown in FIG. 10B, the quartz plate 430 is pushed away from the injector body 410 increasing the size of gap 435. The first clamp 460 is pushed partially out of the clamp portion 422 of the opening 420 due to pressure on the support surface 466 of the extension arm 465 by the quartz plate 430. Movement of the first clamp 460 out of the clamp portion 422 of the opening causes the first screw 470 and first nut 440 to compress the first spring 450. The first spring 450 of some embodiments compresses enough to relieve the torsional strain placed on the quartz plate 430 without allowing the quartz plate 430 or first clamp 460 to become dislodged.

Referring back to FIGS. 6 and 7, in some embodiments there is a second opening 420a extending from the back surface 414 to the front surface 412 of the injector body 410. The second opening 420a has a nut portion adjacent the back surface 414 similar to the nut portion 424 of the first opening 420. A second nut 440a is located within the nut portion of the second opening. A second spring 450a is located within the nut portion of the second opening and separates the second nut 440a from the injector body 410.

In some embodiments, as shown in FIG. 6, the second clamp 460a is located within a clamp portion of the second opening located adjacent the front surface of the injector body. The second clamp is similar to the first clamp and contacts an edge of the quartz plate 430. In some embodiments, a second screw extends through the opening in the second clamp, a portion of the injector body, the second spring and into a connection portion of the second nut.

Figure 11:
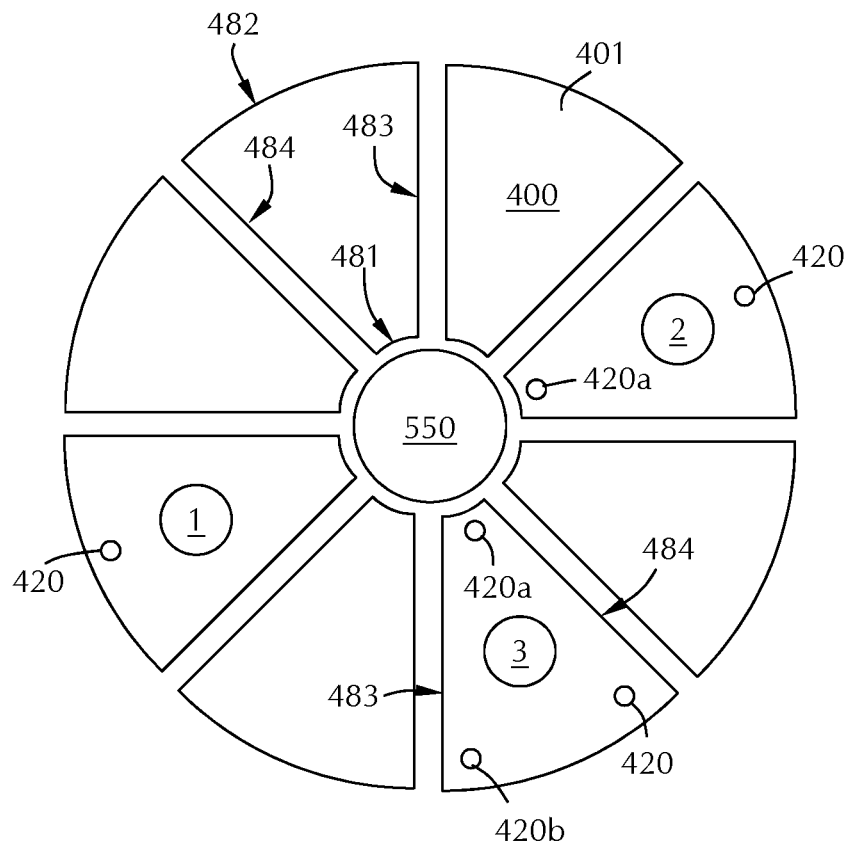
FIG. 11 shows a schematic representation of a gas distribution assembly according to one or more embodiment of the disclosure.

Referring to FIG. 11, some embodiments of the injector body 410 have a wedge-shape with an inner peripheral edge 481, an outer peripheral edge 482, a first side 483 and a second side 484. The location or locations of the openings 420 can be varied depending on the configuration of the injector unit 400. The illustrated embodiment has eight wedge-shaped injector units 400 around a central hub 550. Three of the injector units 400 are annotated for description purposes with a number one, two or three. Referring to injector unit number one, there is one opening 420 located adjacent the outer peripheral edge 482. Injector unit number two has a first opening 420 located adjacent the outer peripheral edge 482 and a second opening 420a located adjacent the inner peripheral edge 481. Injector unit three has a first opening 420 adjacent the outer peripheral edge 482 and second side 484, a second opening 420a adjacent the inner peripheral edge 481 and a third opening 420b adjacent the outer peripheral edge 482 and first side 483.

Figure 12:
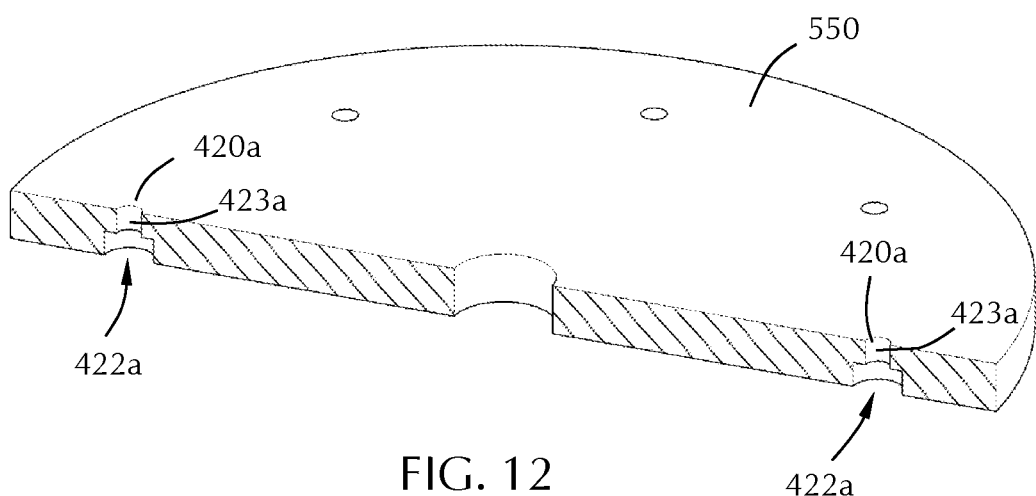
FIG. 12 shows a cross-sectional isometric view of a central hub with partial openings according to one or more embodiment of the disclosure.

In some embodiments, a central hub 550 is connected to the inner peripheral edge 481 of the injector body 410. Referring to FIGS. 9 and 12, in some embodiments, the second opening 420a extends through the injector body 410 and the hub 550 so that the clamp portion 422a of the second opening 420a is in the hub 550 and the second screw 470a further extends through the hub 550.

Figure 13:
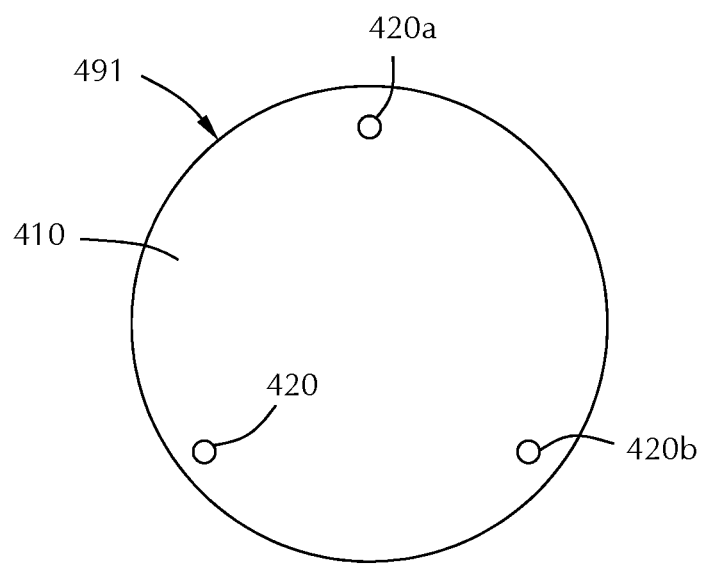
FIG. 13 shows a schematic representation of a circular gas injector unit according to one or more embodiment of the disclosure.

Referring to FIG. 13, in some embodiments, the injector body 410 has a round shape. For example, a single wafer processing showerhead assembly that uses a quartz liner. The injector body 410 has a first opening 420 adjacent an outer edge 491 of the injector body 410. In some embodiments, a second opening 420a is adjacent the outer edge 491. In some embodiments, a second opening 420a and a third opening 420b are adjacent the outer edge 491. The openings can be arranged at various locations around the outer edge. For example, in some embodiments, there are two openings arranged on opposite sides of the injector body. In some embodiments, there are three openings arranged 120° apart around the outer edge.

Some embodiments of the disclosure are directed to gas distribution assemblies comprising one or more injector units 400 as described herein. In some embodiments, as shown in FIG. 11, a plurality of injector units 400 is connected to a central hub 550. In some embodiments, each of the injector units comprises the quartz plate, first opening, second opening, first nut, second nut, first clamp, second clamp, first spring, second spring, first screw and second screw. Some embodiments of the disclosure are directed to processing chambers incorporating a gas distribution assembly comprising one or more injector units 400, as described herein.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated (about the substrate axis) continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A gas injector unit comprising:
an injector body having a front surface and a back surface defining a thickness, the front surface having a plurality of apertures extending into the injector body to allow a flow of gas from within the injector body to exit through the front surface;
a first opening extending from the back surface to the front surface of the injector body, the first opening having a nut portion adjacent the back surface and a clamp portion adjacent the front surface;
a quartz plate having a front surface and a back surface, the back surface positioned adjacent the front surface of the injector body, the quartz plate having a plurality of apertures to allow a flow of gas to pass through the quartz plate;
a first nut located within the nut portion of the first opening;
a first clamp located within the clamp portion of the first opening, the first clamp having a clamp body with an opening therethrough and a support surface extending a distance from the clamp body, the support surface in contact with an edge of the quartz plate;
a first spring located within the nut portion of the first opening between the first nut and the injector body; and
a first screw extending through the opening in the first clamp, a portion of the injector body, the first spring and into a connection portion of the first nut.

2. The gas injector unit of claim 1, further comprising:
a second opening extending from the back surface to the front surface of the injector body, the second opening having a nut portion adjacent the back surface;
a second nut located within the nut portion of the second opening; and
a second spring located within the nut portion of the second opening between the second nut and the injector body.

3. The gas injector unit of claim 2, further comprising:
a second clamp located within a clamp portion of the second opening located adjacent the front surface of the injector body, the second clamp having a clamp body with an opening therethrough and a support surface extending a distance from the clamp body, the support surface in contact with an edge of the quartz plate; and
a second screw extending through the opening in the second clamp, a portion of the injector body, the second spring and into a connection portion of the second nut.

4. The gas injector unit of claim 3, wherein the injector body has a wedge-shape with an inner peripheral edge and an outer peripheral edge, the first opening located adjacent the outer peripheral edge and the second open adjacent the inner peripheral edge.

5. The gas injector unit of claim 4, further comprising a hub connected to the inner peripheral edge of the injector body.

6. The gas injector unit of claim 5, wherein the second opening extends through the injector body and the hub so that the clamp portion of the second opening is in the hub and the second screw further extends through the hub.

7. The gas injector unit of claim 1, wherein the first nut comprises an anti-rotation nut.

8. The gas injector unit of claim 7, wherein the nut portion of the first opening and the first nut have complementary shapes that restrict rotational movement of the first nut within the first opening.

9. The gas injector unit of claim 1, wherein the first spring comprises a wave spring.

10. The gas injector unit of claim 1, wherein the injector body has a round shape and the first opening is adjacent an outer edge of the injector body.

11. The gas injector unit of claim 1, wherein the quartz plate has a thickness defined by the front surface and back surface in the range of about 5 mm to about 25 mm.

12. The gas injector unit of claim 1, wherein the support surface of the first clamp provides an interference fit with the quartz plate.

13. A gas distribution assembly comprising:
a central hub having at least one opening therethrough having a clamp portion adjacent a bottom surface of the hub; and
a plurality of injector units arranged around the central hub, at least one of the injector units comprising:
an injector body having a front surface and a back surface defining a thickness, the front surface having a plurality of apertures extending into the injector body to allow a flow of gas from within the injector body to exit through the front surface;
a first opening extending from the back surface to the front surface of the injector body, the first opening having a nut portion adjacent the back surface and a clamp portion adjacent the front surface;
a quartz plate having a front surface and a back surface, the back surface positioned adjacent the front surface of the injector body, the quartz plate having a plurality of apertures to allow a flow of gas to pass through the quartz plate;
a first nut located within the nut portion of the first opening;
a first clamp located within the clamp portion of the first opening, the first clamp having a clamp body with an opening therethrough and a support surface extending a distance from the clamp body, the support surface in contact with an edge of the quartz plate;
a first spring located within the nut portion of the first opening between the first nut and the injector body; and
a first screw extending through the opening in the first clamp, a portion of the injector body, the first spring and into a connection portion of the first nut;
a second opening extending from the back surface to the front surface of the injector body aligned with the opening in the central hub, the second opening having a nut portion adjacent the back surface of the injector body;
a second nut located within the nut portion of the second opening;
a second spring located within the nut portion of the second opening between the second nut and the injector body;
a second clamp located within the clamp portion of the central hub, the second clamp having a clamp body with an opening therethrough and a support surface extending a distance from the clamp body, the support surface in contact with an edge of the quartz plate; and
a second screw extending through the opening in the second clamp, the central hub, a portion of the injector body, the second spring and into a connection portion of the second nut.

14. The gas distribution assembly of claim 13, wherein the injector body has a wedge-shape with an inner peripheral edge and an outer peripheral edge, the first opening located adjacent the outer peripheral edge and the second open adjacent the inner peripheral edge.

15. The gas distribution assembly of claim 13, wherein the first nut comprises an anti-rotation nut.

16. The gas distribution assembly of claim 15, wherein the nut portion of the first opening and the first nut have complementary shapes that restrict rotational movement of the first nut within the first opening.

17. The gas distribution assembly of claim 16, wherein the nut portion of the second opening and the second nut have complementary shapes that restrict rotational movement of the second nut within the second opening.

18. The gas distribution assembly of claim 13, wherein one or more of the first spring or second spring comprises a wave spring.

19. The gas distribution assembly of claim 13, wherein each of the injector units comprises the quartz plate, first opening, second opening, first nut, second nut, first clamp, second clamp, first spring, second spring, first screw and second screw.

20. A processing chamber comprising:
a gas distribution assembly comprising:
a central hub having at least one opening therethrough having a clamp portion adjacent a bottom surface of the hub; and
a plurality of injector units arranged around the central hub, at least one of the injector units comprising:
an injector body having a front surface and a back surface defining a thickness, the front surface having a plurality of apertures extending into the injector body to allow a flow of gas from within the injector body to exit through the front surface;
a first opening extending from the back surface to the front surface of the injector body, the first opening having a nut portion adjacent the back surface and a clamp portion adjacent the front surface;
a quartz plate having a front surface and a back surface, the back surface positioned adjacent the front surface of the injector body, the quartz plate having a plurality of apertures to allow a flow of gas to pass through the quartz plate;
a first nut located within the nut portion of the first opening;
a first clamp located within the clamp portion of the first opening, the first clamp having a clamp body with an opening therethrough and a support surface extending a distance from the clamp body, the support surface in contact with an edge of the quartz plate;
a first spring located within the nut portion of the first opening between the first nut and the injector body; and
a first screw extending through the opening in the first clamp, a portion of the injector body, the first spring and into a connection portion of the first nut;
a second opening extending from the back surface to the front surface of the injector body aligned with the opening in the central hub, the second opening having a nut portion adjacent the back surface of the injector body;
a second nut located within the nut portion of the second opening;
a second spring located within the nut portion of the second opening between the second nut and the injector body;
a second clamp located within the clamp portion of the central hub, the second clamp having a clamp body with an opening therethrough and a support surface extending a distance from the clamp body, the support surface in contact with an edge of the quartz plate;
a second screw extending through the opening in the second clamp, the central hub, a portion of the injector body, the second spring and into a connection portion of the second nut; and
a susceptor assembly comprising a susceptor having a top surface with a plurality of recesses formed therein to support a plurality of wafers and rotate the plurality of wafers around a central axis of the susceptor assembly so that the wafers are a distance from the front face of the quartz plate on the injector unit.

* * * * *